(12) United States Patent
Nam

(10) Patent No.: US 7,341,955 B2
(45) Date of Patent: Mar. 11, 2008

(54) METHOD FOR FABRICATING SEMICONDUCTOR DEVICE

(75) Inventor: Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/357,262

(22) Filed: Feb. 17, 2006

(65) Prior Publication Data
US 2007/0000860 A1    Jan. 4, 2007

(30) Foreign Application Priority Data
Jun. 30, 2005    (KR) .................. 10-2005-0058660

(51) Int. Cl.
*H01L 21/302* (2006.01)
(52) U.S. Cl. .............. 438/709; 438/717; 438/720; 438/736; 438/742
(58) Field of Classification Search ........... 438/709, 438/717, 720, 736, 742
See application file for complete search history.

(56) References Cited

U.S. PATENT DOCUMENTS 7,064,078 B2 * 6/2006 Liu et al. .................. 438/717
2004/0092098 A1 * 5/2004 Sudijono et al. ........... 438/637
2006/0154477 A1 * 7/2006 Geng et al. ................ 438/637

FOREIGN PATENT DOCUMENTS

| KR | 2001-0065794 | 7/2001 |
| KR | 10-0327346 | 2/2002 |
| KR | 10-2005-0108210 | 11/2005 |

* cited by examiner

*Primary Examiner*—Binh X. Tran
(74) *Attorney, Agent, or Firm*—Blakely Sokoloff Taylor & Zafman

(57) ABSTRACT

A method for fabricating a semiconductor device is provided. The method includes: forming an insulation layer over a substrate; forming a hard mask layer over the insulation layer; forming a photoresist pattern over the hard mask layer; forming a polymer over the photoresist pattern to increase a thickness of the photoresist pattern; patterning the hard mask layer by using the photoresist pattern having the increased thickness; and selectively removing the insulation layer by using the photoresist pattern having the increased thickness and the hard mask layer as an etch mask to form a contact hole.

10 Claims, 3 Drawing Sheets

METHOD FOR FABRICATING SEMICONDUCTOR DEVICE

FIELD OF THE INVENTION

The present invention relates to a method for fabricating a semiconductor device; and, more particularly, to a method for forming a contact hole in a semiconductor device.

DESCRIPTION OF RELATED ARTS

Fabrication of a semiconductor device includes fabricating a mask corresponding to a pattern, forming a photoresist layer on a substrate, and patterning the photoresist layer by employing a photolithography process using the mask.

Subsequently, a bottom structure is patterned by a dry or a wet etch process using the patterned photoresist layer. Next, the patterned photoresist layer is removed. Furthermore, a next patterned layer is formed. Then, the above processes are repeatedly performed.

Formation of a contact hole includes forming an insulation layer wherein the contact hole is to be formed, and selectively removing the insulation layer to thereby form the contact hole. A conductive layer fills the contact hole to form a contact plug connecting a first conductive layer formed at a bottom region and a second conductive layer to be formed at an upper region.

As technology has become more improved, a patterning width has been reduced down to 90 nm. The patterning width of a contact hole for forming a contact plug has become narrower and a depth of the same has become deeper. Thus, it has become an extremely difficult process to form a stable contact hole.

It is difficult to form a narrower and deeper contact hole in a semiconductor device only by employing the processes including the forming of the photoresist pattern, and the selectively removing of the insulation layer using the photoresist pattern. Thus, recently, processes including forming a hard mask pattern using a photoresist pattern, and performing a selective etch process using the hard mask pattern are being used.

Typically, the hard mask pattern includes one of a polysilicon layer and a nitride-based layer.

When forming a contact hole by employing a polysilicon layer or a nitride-based layer, the entrance to the contact hole becomes distorted because of a limitation in a thickness increase of the hard mask pattern and an etch loss of the hard mask pattern during an etching process for the contact hole.

FIGS. 1 and 2 illustrate a contact hole formed by using a hard mask pattern including one of a polysilicon layer and a nitride-based layer. In FIG. 1, the entrance to the contact hole is distorted, and in FIG. 2, the contact hole is distorted down to the bottom surface of the contact hole.

Such distortion may cause a change in the size of the bottom surface of the contact hole and accordingly, a change in a contact hole resistance. The change in the size of the bottom surface of the contact hole may generate a substantial limitation in forming a contact plug stably contacting a conductive layer at the bottom.

That is, when a contact hole is distorted, a subsequent contact plug may not be able to electrically contact a conductive layer formed at the bottom, stably. Also, an adjacent conductive pattern, which should maintain an insulation state, may have a short circuit.

SUMMARY OF THE INVENTION

It is, therefore, an object of the present invention to provide a method for fabricating a semiconductor device capable of stably forming a contact hole.

In accordance with an aspect of the present invention, there is provided a method for fabricating a semiconductor device, including: forming an insulation layer over a substrate; forming a hard mask layer over the insulation layer; forming a photoresist pattern over the hard mask layer; forming a polymer over the photoresist pattern to increase a thickness of the photoresist pattern; patterning the hard mask layer by using the photoresist pattern having the increased thickness; and selectively removing the insulation layer by using the photoresist pattern having the increased thickness and the hard mask layer as an etch mask to form a contact hole.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for fabricating a semiconductor device in accordance with specific embodiments of the present invention will be described in detail with reference to the accompanying drawings.

A specific embodiment of the present invention uses a metal-based layer, instead of a polysilicon layer, for a hard mask layer to stably form a contact hole necessary when fabricating a semiconductor device under 90 nm. The metal-based layer is used because the metal-based layer can increase an etch margin.

Also, an etch gas used for patterning the hard mask layer and a bonding of a polymer generated by a reaction during etching are both formed with metal-based amorphous hydrogenated carbon to be deposited on a photoresist layer. Thus, an etch loss of the photoresist layer and the hard mask layer is reduced during deep etching of the contact hole, so that an etch margin is improved, and an abnormal pattern is reduced with respect to the contact hole.

Figure 1:
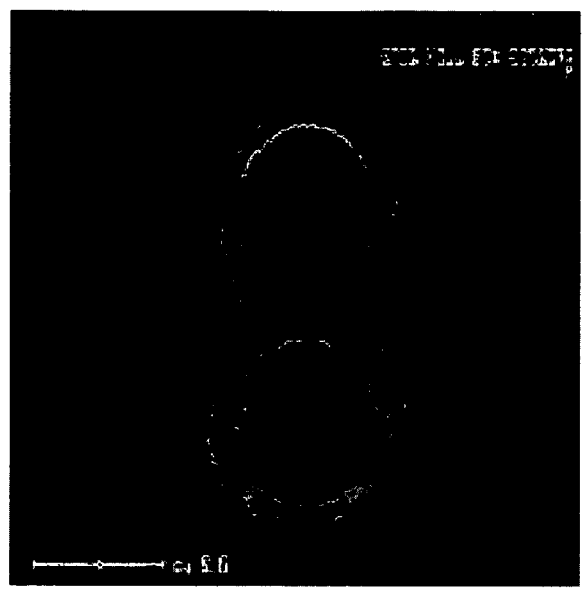
FIGS. 1 and 2 are micrographic views of contact holes in a semiconductor device fabricated by a conventional method.
Figure 2:
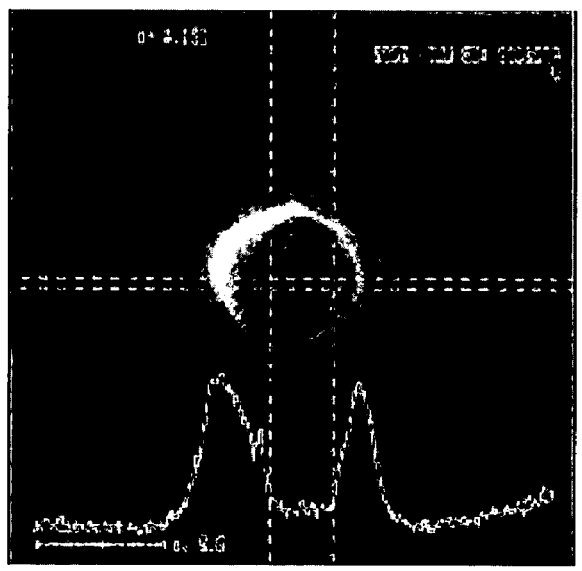
Figure 3:
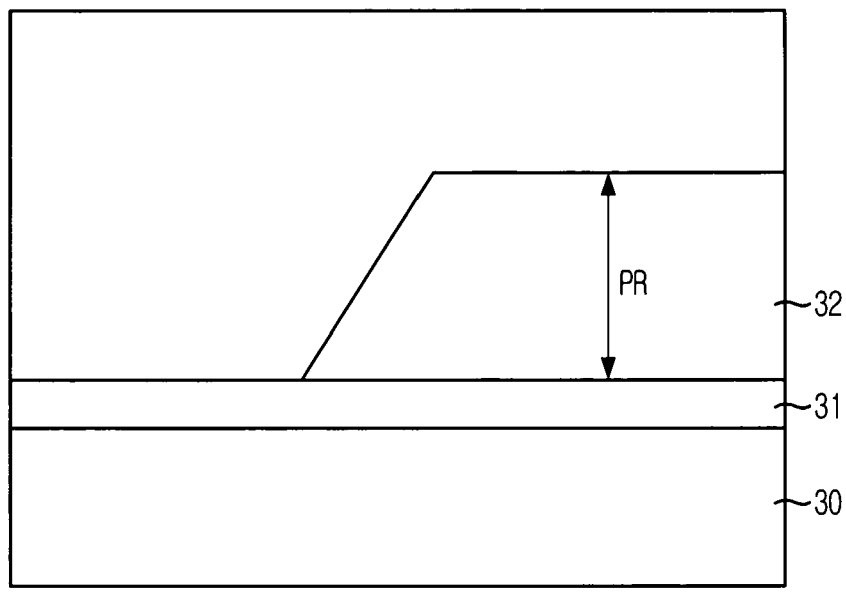
FIGS. 3 to 5 are diagrams illustrating a method for fabricating a semiconductor device in accordance with a specific embodiment of the present invention.
Figure 4:
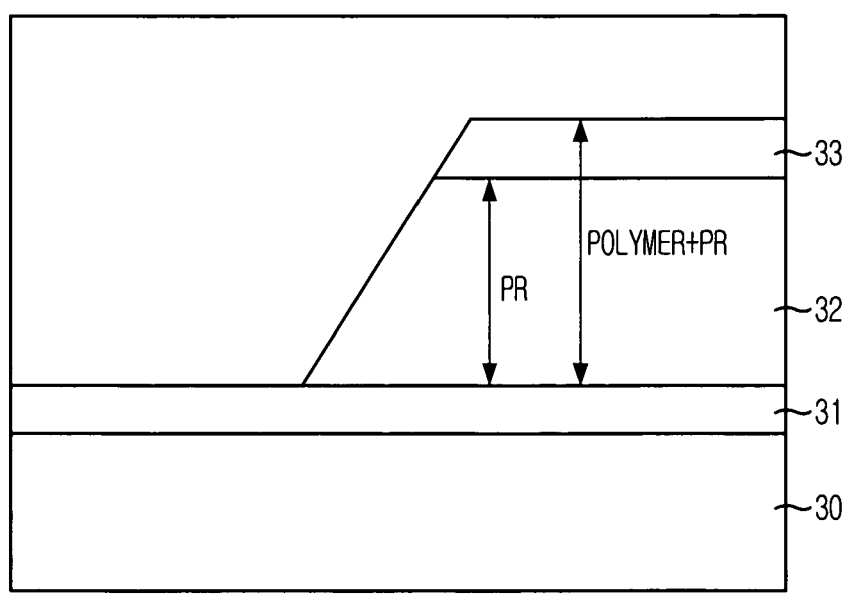

FIGS. 3 and 4 are diagrams illustrating a method for fabricating a semiconductor memory device in accordance with the specific embodiment of the present invention.

As shown in FIG. 3, a hard mask layer 31 is formed over a substrate 30. Herein, predetermined processes have been performed on the substrate 30. Then, a photoresist pattern 32 is formed over the hard mask layer 31.

As shown in FIG. 4, a polymer 33 including metal-based amorphous hydrogenated carbon is generated and formed over the photoresist pattern 32.

Thus, after the above processes, a thickness of the photoresist pattern 32 increases due to the polymer 33.

Figure 5:
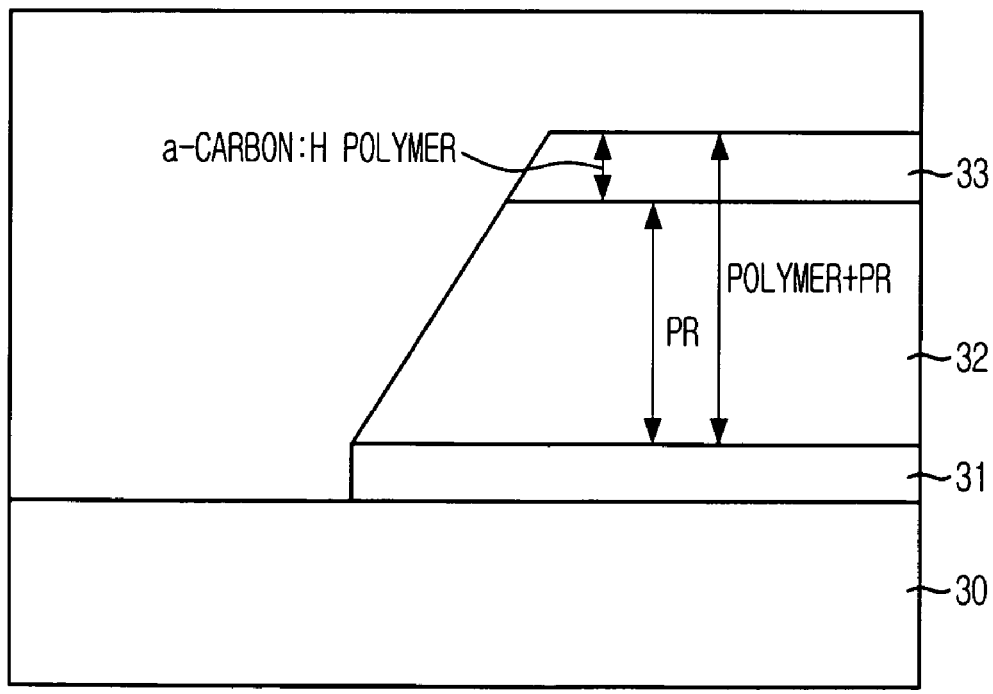

As shown in FIG. 5, the hard mask layer 31 is patterned by using the photoresist pattern 32 as an etch barrier.

Subsequently, an insulation layer at the bottom is selectively removed to form a contact hole using the photoresist pattern 32 which increased in thickness due to the hard mask 31 and the polymer 33.

Herein, the hard mask layer 31 includes a metal such as zinc (Zn), zinc oxide (ZnO), titanium (Ti), or titanium nitride (TiN) and is formed to a thickness ranging from approximately 300 Å to approximately 3,000 Å.

The polymer 33 is formed in a hydrogen atmosphere induced by using a main gas, e.g., hydrogen ($H_2$), methane ($CH_4$), or trifluoromethane ($CHF_3$), and a subsidiary gas, e.g., argon (Ar). The subsidiary gas functions as a diluting gas.

With respect to the subsidiary gas, i.e., Ar gas, the main gas covers at least 60% of the entire flow quantity of the main gas and the subsidiary gas. Herein, the entire flow quantity ranges from approximately 80 sccm to 150 sccm.

The polymer 33 is formed using a plasma power applied in a specific condition that a top power ranges from approximately 500 W to approximately 900 W and a bottom power ranges from approximately 400 W to approximately 600 W.

By performing the above processes, the hard mask layer 31 is protected from being patterned, and the polymer 33 is formed over the photoresist pattern 32. Herein, above a certain thickness of the polymer 33 is achieved by repeatedly performing the above formation processes.

At this time, a width of the contact hole may be decreased because of the polymer 33 formed on the photoresist pattern 32. In this case, the photoresist pattern 32 should generally be formed slightly larger than the width of the contact hole.

Subsequently, under the substantially identical conditions as above, the hard mask layer 31 is patterned by using the photoresist pattern 32 with the bottom power increased to range from approximately 600 W to approximately 800 W.

Therefore, a distorted contact hole entrance, caused by a lack of margin in the patterned hard mask layer 31 during the conventional formation of the deep contact hole, can be reduced by using the photoresist pattern 32 which increased in thickness due to the hard mask layer 31 and the polymer 33.

In accordance with the specific embodiment of the present invention, a deep contact hole, demanded by a highly integrated semiconductor device, can be stably formed by: using a metal-based hard mask layer; forming a polymer on a photoresist pattern; and then, forming the contact hole.

The present application contains subject matter related to the Korean patent application No. KR 2005-58660, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an insulation layer over a substrate;
    forming a hard mask layer over the insulation layer;
    forming a photoresist pattern over the hard mask layer;
    forming a polymer over the photoresist pattern to increase a thickness of the photoresist pattern;
    patterning the hard mask layer by using the photoresist pattern having the increased thickness; and
    selectively removing the insulation layer by using the photoresist pattern having the increased thickness and the hard mask layer as an etch mask to form a contact hole,
    wherein forming the polymer and patterning the hard mask layer are controlled by changing a power level under substantially identical conditions.

2. The method of claim 1, wherein the forming of the polymer includes amorphous hydrogenated carbon.

3. The method of claim 1, wherein the forming of the hard mask layer includes a metal.

4. The method of claim 3, wherein the forming of the hard mask layer includes at least one metal selected from the group consisting of zinc (Zn), zinc oxide (ZnO), titanium (Ti), and titanium nitride (TiN).

5. The method of claim 1, wherein the forming of the polymer includes using a main gas comprising one selected from the group consisting of hydrogen ($H_2$), methane ($CH_4$), and trifluoromethane ($CHF_3$).

6. The method of claim 5, wherein the main gas covers at least 60% of the entire flow quantity with respect to a diluting gas.

7. The method of claim 6, wherein the entire flow quantity ranges between 80 sccm and 150 sccm.

8. The method of claim 6, wherein the diluting gas includes Ar gas.

9. The method of claim 5, wherein the forming of the polymer includes using a plasma power with a top power ranging from approximately 500 W to approximately 900 W, and a bottom power ranging from approximately 400 W to approximately 600 W.

10. The method of claim 9, wherein the patterning of the hard mask layer by using the photoresist pattern having the increased thickness includes using the photoresist pattern with the increased bottom power ranging between approximately 600 W to approximately 800 W under the substantially identical conditions for forming the polymer.

* * * * *